United States Patent
Sakai et al.

[11] Patent Number: 6,113,836
[45] Date of Patent: Sep. 5, 2000

[54] METHOD OF FORMING THICK FILM PATTERN AND MATERIAL FOR FORMING THICK FILM PATTERN

[75] Inventors: Yorihiko Sakai; Norikatsu Ono; Norikazu Mineo; Takeshi Matsumoto; Hideaki Fujii, all of Tokyo, Japan

[73] Assignee: Dai Nippon Insatsu Kabushiki Kaisha, Japan

[21] Appl. No.: 09/100,974

[22] Filed: Jun. 22, 1998

Related U.S. Application Data

[62] Division of application No. 08/694,025, Aug. 8, 1996, Pat. No. 5,814,267, which is a division of application No. 07/762,008, Sep. 19, 1991, Pat. No. 5,580,511.

[30] Foreign Application Priority Data

| | | | |
|---|---|---|---|
| Jan. 25, 1990 | [JP] | Japan | 2-15431 |
| Apr. 5, 1990 | [JP] | Japan | 2-90928 |
| Dec. 25, 1990 | [JP] | Japan | 2-413682 |

[51] Int. Cl.$^7$ .................................................. C04B 37/00
[52] U.S. Cl. .................... 264/400; 264/402; 264/610; 264/642; 264/225; 264/226; 264/227; 264/317
[58] Field of Search ...................... 264/496, 402, 264/610, 642, 317, 225, 226, 227

[56] References Cited

U.S. PATENT DOCUMENTS

| | | |
|---|---|---|
| 3,870,776 | 3/1975 | McMahon . |
| 4,119,480 | 10/1978 | Nishi et al. . |
| 4,336,320 | 6/1982 | Cummings et al. . |
| 4,555,285 | 11/1985 | Chance . |
| 4,576,850 | 3/1986 | Martens ................................ 264/496 |
| 4,619,804 | 10/1986 | Leonard et al. ..................... 264/496 |
| 4,816,200 | 3/1989 | Stecher . |
| 4,994,215 | 2/1991 | Wiech . |
| 5,124,089 | 6/1992 | Ohkoshi et al. ..................... 264/496 |
| 5,183,597 | 2/1993 | Lu ........................................ 264/496 |
| 5,328,816 | 7/1994 | Tamura . |
| 5,814,262 | 9/1998 | Ketcham et al. .................... 264/317 |
| 5,814,267 | 9/1998 | Sakai et al. ......................... 264/496 |

FOREIGN PATENT DOCUMENTS 1915756 10/1970 Germany .

OTHER PUBLICATIONS

World Patents Index, week 2278, AN=78–39632A, Derwent Publications Ltd, London, GB; & JP–A–53 045 290 (Koatsu Gas Kogyo K.K.) Apr. 22, 1978* Abstract*.

Microelectronics and Reliability, vol. 25, No. 1, 1985, pp. 61–63, Oxford, GB; A. Singh et al.: "Reverse photolithographic technique for thick film circuits"* Whole document*.

Patent Abstracts of Japan, vol. 008, No. 059 (E–232) Mar 17 1984 & JP–A–58 209 852 (Futaba Denshi Kogyo KK) Dec. 6 1983.

*Primary Examiner*—James Derrington
*Attorney, Agent, or Firm*—Parkhurst & Wendel, LLP

[57] ABSTRACT

A female mold (2, 12, 22, 32, 42, 52, 62) having a desirable pattern is formed on a substrate (1, 11, 21, 31, 41, 51, 61). Next, ceramic material (3, 13, 23, 33, 43, 53, 63) is filled in spaces in the female mold. Thereafter, the female mold is removed by heating the entire substrate, whereby a desirable thick film pattern can be finely and easily formed. The inorganic paste material comprising inorganic liquid vehicle containing water glass as main ingredient and powdery solid dispersed in the inorganic liquid vehicle is used as the ceramic material. The volume change of the inorganic paste material is small during the drying and calcinating processes, thus the inorganic paste material is prevented from being broken.

2 Claims, 11 Drawing Sheets

METHOD OF FORMING THICK FILM PATTERN AND MATERIAL FOR FORMING THICK FILM PATTERN

This is a Division of application Ser. No. 08/694,025 filed Aug. 8, 1996 now U.S. Pat. No. 5,814,267 which in turn is a divisional of Ser. No. 07/762,008, filed Sep. 19, 1991 now U.S. Pat. No. 5,580,511.

TECHNICAL FIELD

The present invention relates to a method of forming a thick film pattern in a manufacturing process of a liquid crystal display device, a display panel made of fluorescent character display tubes, a plasma display panel, a hybrid integrated circuit and the like, and material for forming a thick film pattern which is used in the method of forming a thick film pattern.

BACKGROUND ART

Conventionally, there is known a method of forming a thick film pattern by the steps of printing a paste for the conductor or insulator on a substrate made of glass or ceramic in the form of a pattern by screen printing, drying and calcinating the paste, and repeating the above steps. Recently in various fields, thick film patterns are formed on a substrate made of glass or the like using ceramic material. In this case, paste-like ceramic materials which are formed by dispersing ceramics in a binder are employed, and similarly, the thick film pattern is formed by the steps of printing the paste-like ceramic material by screen printing, drying and calcinating the paste-like ceramic material, and repeating the above steps.

In the conventional method of forming a thick film pattern on a glass substrate using a ceramic material by screen printing, in order to attain a film pattern having a desirable thickness, it is necessary to repeat screen printing several times. That is, in this method, it is necessary to repeat the screen printing five to ten times in order to attain a thick film having a thickness of 50 to 100 μm, and a drying process is required every time. Therefore, the productivity is extremely low and the yield rate is lowered. Further, there is the problem that the accuracy of a line width of pattern is impaired due to viscosity of the paste, thixotropy or the like.

DISCLOSURE OF INVENTION

It is therefore a primary object of the present invention to provide a method of forming a thick film pattern which can improve the productivity and the yield rate, and can obtain an accurate line width of pattern.

A second object of the present invention is to provide a method of forming a thick film pattern in which ceramic material can reliably adhere to a substrate.

A third object of the present invention is to provide a method of forming a thick film pattern and material for forming a thick film pattern which can prevent paste material from being broken when drying and calcinating the same and strengthen the binding force between powdery solids and the adhesive force between powder solid and a substrate, and which can form a desirable thick film pattern by a calcinating process at a low temperature.

(1) According to a first aspect of the present invention, in a method of forming a thick film pattern by ceramic material on a substrate, the method comprising the steps of: forming a female mold having a desirable pattern on the substrate by other material except for ceramic material; filling the ceramic material in a space in the female mold; and causing the female mold to be removed (i.e., to vanish).

(2) According to a second aspect of the present invention, in the first aspect, the step of forming the female mold comprises the steps of providing a photoresist layer on the substrate and performing pattern exposure and development of the photoresist layer.

(3) According to a third aspect of the present invention, in the first aspect, the step of forming the female mold comprises the step of providing an ultraviolet curing resin having a desirable pattern on the substrate of 2P process.

(4) According to a fourth aspect of the present invention, in the first aspect, the step of forming the female mold comprises the step of foaming an organic foam provided on the substrate so as to have a desirable pattern.

(5) According to a fifth aspect of the present invention, in the first aspect, the step of forming the female mold comprises the steps of: coating an ultraviolet curing resin on the original plate having a concave-convex surface corresponding to a desirable pattern; providing a substrate film on the ultraviolet curing resin; forming a tentative female mold having a groove with a desirable pattern on the substrate film after curing the ultraviolet curing resin by ultraviolet rays and removing the same from the original plate; adhering the tentative female mold carrying the substrate film to the substrate in such a manner that the groove is in contact with the substrate; and removing the upper portion of the tentative female mold after removing the substrate film from the tentative female mold.

(6) According to a sixth aspect of the present invention, in the first aspect, the step of forming the female mold comprises the steps of: providing one photoresist layer on the substrate; performing pattern exposure and development of the one photoresist layer; providing an upper photoresist layer of a desirable height on the one photoresist layer; and performing pattern exposure and development of the upper photoresist layer.

(7) According to a seventh aspect of the present invention, in the first aspect, the step of forming a female mold comprises the steps of: providing a photoresist layer having a desirable height on the substrate; performing pattern exposure and development of the photoresist layer; and causing a poor development portion of the photoresist layer to be removed by dry etching.

(8) According to an eighth aspect of the present invention, in the first aspect, the step of filling ceramic material in the space of the female mold comprises the step of filling inorganic paste material 3 in the female mold, the inorganic paste material containing powdery solid dispersed in an inorganic liquid vehicle whole main ingredient is water glass as ceramic material, and the step of causing the female mold to be removed comprises the step of heating the entire substrate.

(9) According to a ninth aspect of the present invention, there is provided a material for forming a thick film pattern comprising an inorganic paste material, the inorganic paste material comprising: inorganic liquid vehicle containing water glass as main ingredient; and powdery solid dispersed in the inorganic liquid vehicle, wherein the inorganic paste material contains water glass of 10 to 90% by weight.

BEST MODE FOR CARRYING OUT THE INVENTION

Section 1

A First Embodiment of a Method of Forming Thick Film Pattern 1-1 Basic Method

Figure 1A:
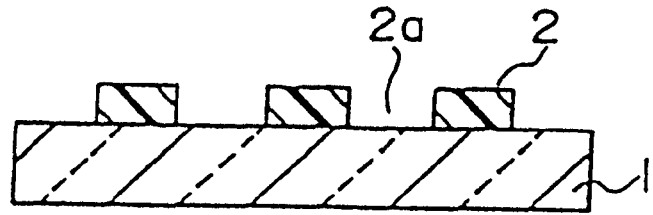
FIGS. 1(a) through 1(c) are explanatory views showing a basic method concerning a method of forming a thick film pattern according to a first embodiment of the present invention.
Figure 1B:
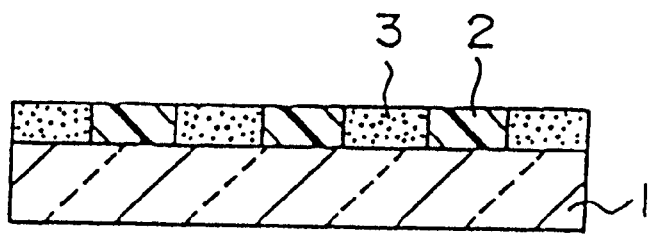
Figure 1C:
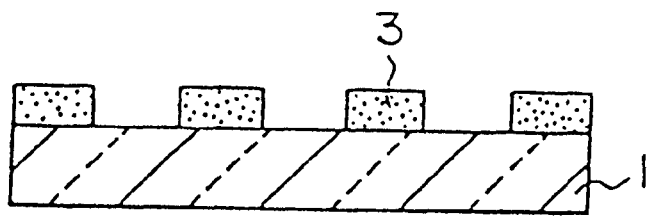

A basic method concerning the method of forming a thick film pattern according to the first embodiment of the present invention is shown in FIGS. 1(a) through 1(c).

First, a female mold 2 having a desirable pattern is formed on a substrate 1 made of glass or the like using material such as photoresist as shown in FIG. 1(a). Then, ceramic material 3 is filled in spaces 2a defined in the female mold 2 as shown in FIG. 1(b). Thereafter, the female mold 2 is removed by chemical treatment or calcinating treatment, thereby obtaining the thick film pattern made of the ceramic materials 3 as shown in FIG. 1(c).

1-2 Embodiment

Next, an embodiment of the present invention will be described with reference to FIGS. 2(a) through 2(e).

Figure 2A:
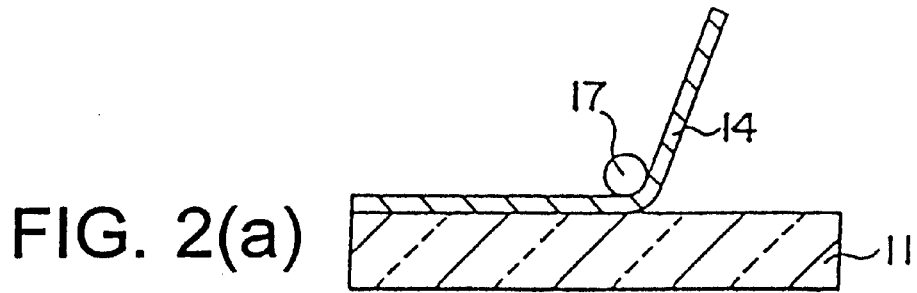
FIGS. 2(a) through 2(e) are explanatory views showing a specific method of forming a thick film pattern according to a first embodiment of the present invention.

FIGS. 2(a) through 2(e) are explanatory views showing a forming process of a female mold using photoresist in a method of thick film pattern of the present invention. FIG. 2(a) shows a process for forming a photoresist layer on a substrate, FIG. 2(b) a process for pattern exposure, FIG. 2(c) a developing process, FIG. 2(d) a process for filling ceramic material, and FIG. 2(e) a process for calcinating.

In this embodiment, a dry film (AP-850 manufactured by Tokyo Ouka Industry Co.) which was used in a photomechanical process was used to easily form a thick film as the photoresist. A dry film which is used in the field of electronics may be used as well. However, this choice does not restrict the scope of the present invention, that is, a suitable photoresist can be chosen in accordance with pattern size.

Each process will be described in order with reference to FIG. 2. First, a dry film as a photoresist 14 on a glass substrate 11 was arranged in four layers to thereby obtain the layers having a thickness of 200 $\mu$m using a laminate roll 17 by a heating laminate method.

Figure 2B:
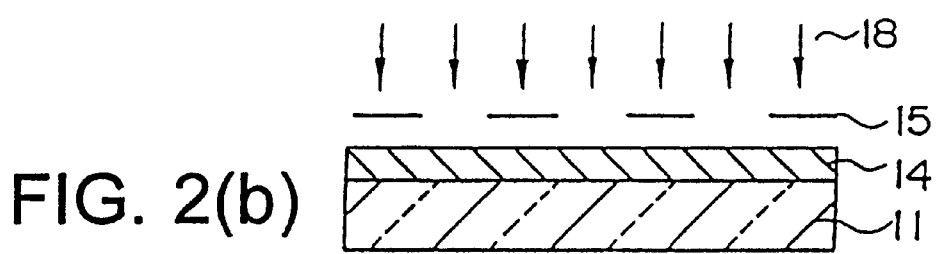

Thereafter, a parallel light 18 was irradiated onto the dry film using a parallel light printer incorporating an ultra high-pressure mercury lamp as a light source, as shown in FIG. 2(b), thereby performing pattern exposure through a line pattern mask 15 having a line width of 100 $\mu$m and a pitch of 300 $\mu$m. The exposure conditions were an intensity of 200 $\mu$w/cm$^2$ and irradiation amount of 250 mJ/cm$^2$ when measured by wave length of 365 nm.

Figure 2C:
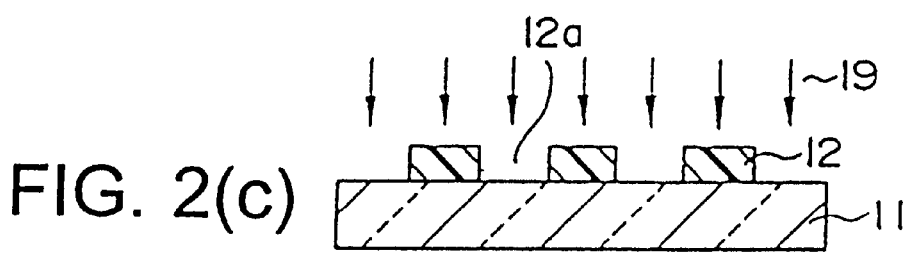

Next, in the developing process in FIG. 2(c), spray development was carried out by aqueous solution 19 containing sodium carbonate anhydride of 1% by weight at a liquid temperature of 30 to 50° C. The termination point of development was confirmed by the naked eye. A female mold 12 having a desirable pattern having a line width of 200 $\mu$m, a pitch of 300 $\mu$m and a height of 200 $\mu$m was obtained through the above processes.

Figure 2D:
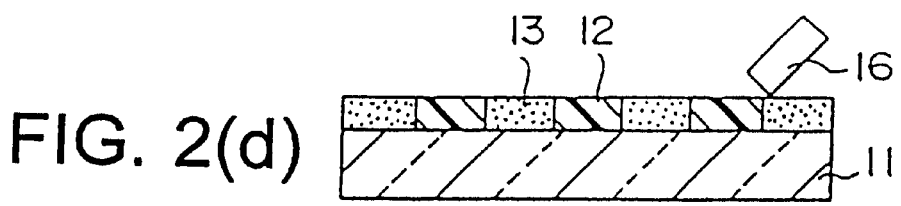

In the filling process for the ceramic material in FIG. 2(d), as ceramic material 13, a paste-like mixture containing glass frit having a low melting point, heat-resistant pigment and filling agent dispersed in organic binder was used. A flat rubber plate 16 was brought into contact with a female mold 12 and moved across the pattern of the female mold 12, whereby the paste-like ceramic material 13 was filled in the spaces 12a of the female mold 12 and excessive ceramic material which was forced out was scraped. Then the substrate 11 and the ceramic material 13 filled in the spaces 12a of the female mold 12 were dried at a temperature of 80 to 120° C. to remove solvent contained in the organic binder and fed to the calcinating process. Incidentally, the filling process of the paste-like ceramic material 13 may be repeated several times, if necessary.

Figure 2E:
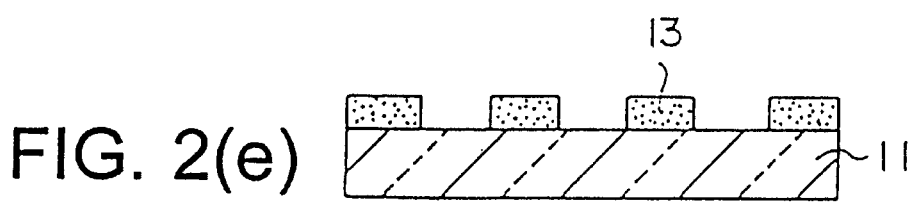

In the calcinating process in FIG. 2(e), the substrate 11 and the female mold 12 carrying the ceramic material were calcinated for 10 to 20 minutes at a peak temperature of 585° C., whereby the female mold 12 formed by the photoresist was removed and the ceramic material 13 adhered to the glass substrate 11.

The thick film pattern made of the ceramic material 13 having a line width of 100 to 200 $\mu$m, a pitch of 300 $\mu$m and a height of 150 $\mu$m was obtained through the above processes.

1-3 Effect

According to the first embodiment, the following effects were obtained.

(1) Since a pattern having a height of not less than 100 $\mu$m could be obtained by only one operation, the operating time could be shortened when compared with the laminating method used for conventional screen printing.

(2) Since operations such as positioning were performed only once, the process was simplified.

Section 2

A Second Embodiment of a Method of Forming a Thick Film Pattern 2-1 Embodiment

A second embodiment of the present invention will be described with reference to FIGS. 3(a) through 3(c) and 4(a) through 4(c).

Figure 3A:
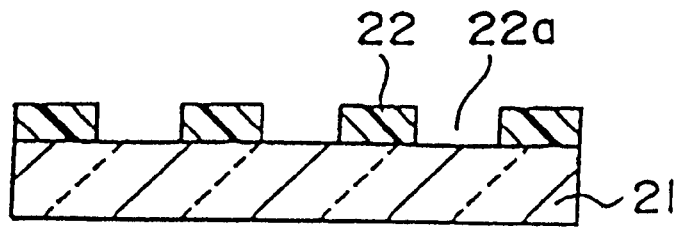
FIGS. 3(a) through 3(c) are explanatory views showing a method of forming a thick film pattern according to a second embodiment of the present invention.
Figure 3B:
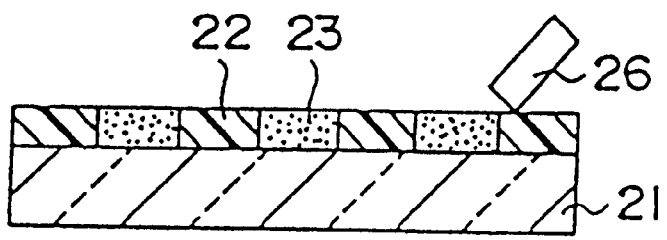
Figure 3C:
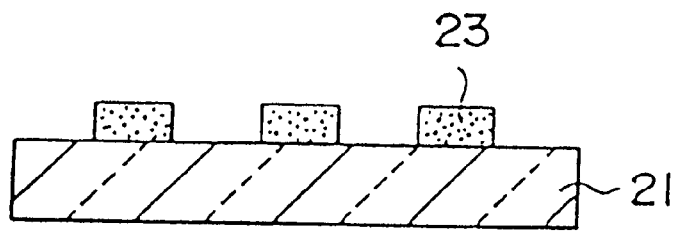

FIGS. 3(a) through 3(c) are explanatory views showing the method of forming a thick film pattern according to the second embodiment of the present invention. In this embodiment, the material for forming the female mold was ultraviolet curing resin. In the drawings, FIG. 3(a) shows a molding process using 2P (Photopolymerization) method, FIG. 3(b) shows a filling process of ceramic material and FIG. 3(c) shows a calcinating process.

Figure 4A:
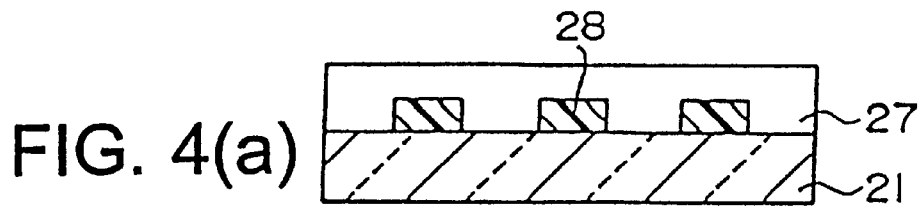
FIGS. 4(a) through 4(c) are explanatory views showing concretely 2P method concerning a method of forming a thick film pattern according to a second embodiment of the present invention.
Figure 4B:
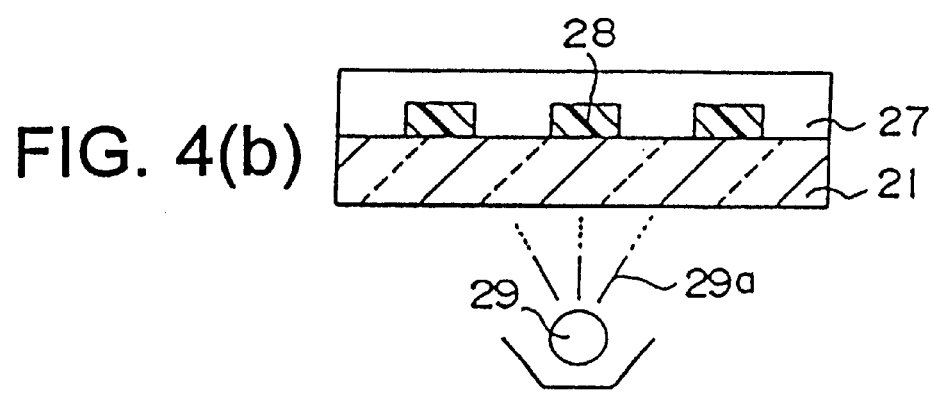
Figure 4C:
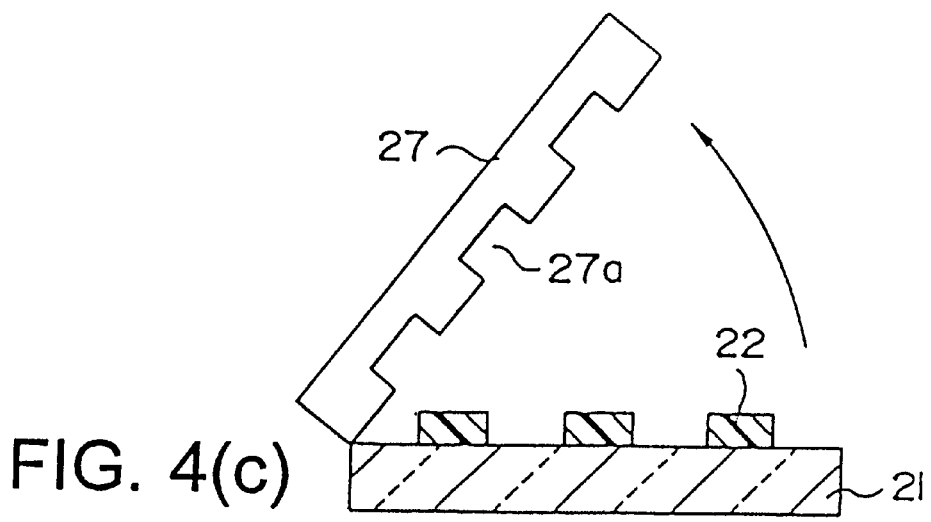

FIGS. 4(a) through 4(c) are explanatory views showing the above-mentioned 2P method. In the drawings, FIG. 4(a) shows an adhering process of an original plate and a substrate through an ultraviolet curing resin FIG. 4(b) shows an irradiating process of ultraviolet rays, and FIG. 4(c) shows the removing process.

In the processes in FIGS. 4(a) through 4(c), in this embodiment, as an original plate 27, a brass plate on the market was used and machined to form grooves having a line width of 200 $\mu$m, a pitch of 300 $\mu$m and a depth of 150 $\mu$m. As a substrate 21, a glass plate was used. One of the original plate 27 and the substrate 21 was transparent to transmit ultraviolet rays at the ultraviolet ray irradiating process.

As ultraviolet curing resin 28, acrylic monomer such as hydroxy-ethyl acrylate, hydroxy-ethyl methacrylate, neopentyl glycol diacrylate, or trimethylol propane triacrylate, acrylic oligomer such as epoxy acrylate, polyester acrylate, or urethane acrylate, or mixture of the above monomer and the above oligomer was preferable. In this embodiment, as ultraviolet curing resin, hydroxy pivalic acid ester neopentyl glycol diacrylate may be used. Furthermore, as the initiator, reagents on the market may be applicable, in this embodiment, 1-hydroxycyclohexyl phenyl ketone was used. The scope of the present invention is not restricted by the choice of the above monomer, oligomer or mixture. It is preferable to choose ultraviolet curing resin which is easily removed in the calcinating process in FIG. 3(c). Further, primer may be used in the case where only the ultraviolet curing resin 28 does not adhere to the substrate 21.

Each process in FIGS. 4(a) through 4(c) will be described below. First, the original plate 27 having the grooves 27a with a desirable pattern was brought into contact with the glass substrate 21 through the ultraviolet curing resin 28 using a flat press or a laminate roll as shown in FIG. 4(a). Next, the ultraviolet curing resin 28 was cured by irradiating the ultraviolet rays 29a from the side of the glass substrate 21. As ultraviolet ray source 29, a high-pressure mercury lamp (40 w/cm$^2$) was used and quantity of light of 1000 mJ/cm$^2$ was irradiated. Thereafter, the original plate 27 was removed from the ultraviolet curing resin 28, thereby forming a female mold 22 made of the ultraviolet curing resin 28 having a desirable pattern with a line width of 200 $\mu$m, a pitch of 300 $\mu$m and a height of 150 $\mu$m.

With the above processes, the substrate 21 carrying the female mold 22 with a desirable pattern was obtained. Thereafter, in the same manner as the first embodiment, the ceramic material 23 was filled in the spaces 22a of the female mold 22 as shown in FIG. 3(b), calcination was performed as shown in FIG. 3(c), thereby obtaining the thick film pattern with a line width of 200 $\mu$m, a pitch of 300 $\mu$m and a height of 150 $\mu$m using the ceramic material 23.

Section 3

A third Embodiment of a Method of Forming Thick Film Pattern 3-1 Embodiment

A third embodiment of the present invention will be described with reference to FIGS. 5(a) through 5(d).

In this embodiment, organic foam was used as material for forming the female mold.

Figure 5A:
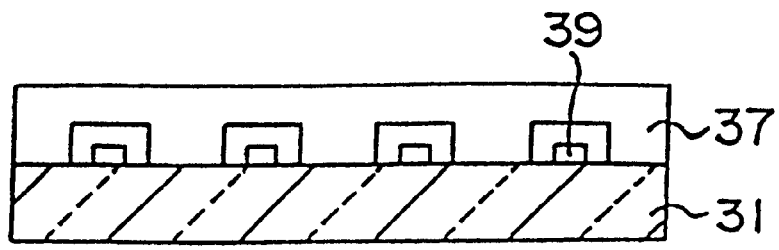
FIGS. 5(a) through 5(d) are explanatory views showing a method of forming a thick film pattern according to a third embodiment of the present invention.

In FIG. 5(a), a foam ink 39 was printed on the glass substrate 31 so as to form a desirable pattern with a line width of 40 $\mu$m, a pitch of 300 $\mu$m and a height of 30 $\mu$m by screen printing. In this case, a screen printing plate having #325 stainless steel mesh and emulsion with a thickness of 30 $\mu$m was used.

Thereafter, the foam ink 39 was covered with the original plate 37 having grooves 37a with a desirable pattern. In this case, the foam ink 39 was covered with the original plate 37 so that the form ink 39 was accommodated in the grooves 37a.

Figure 5B:
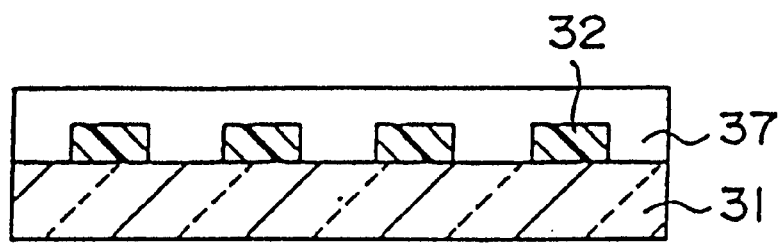
Figure 5C:
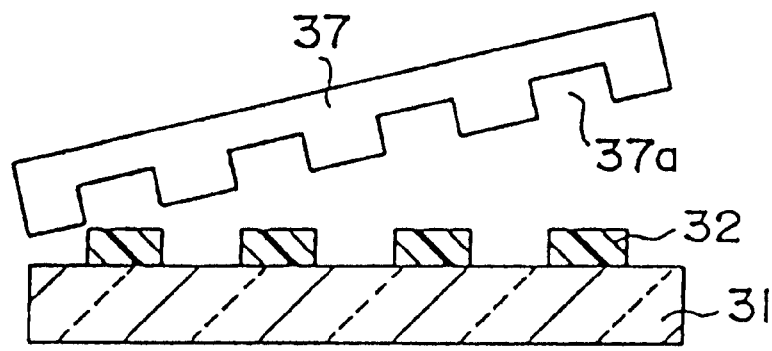

Next, heating treatment was carried out for ten minutes at a temperature of 130° C., thereby foaming the foam ink 39 in the original plate 37 and forming the female mold 32 with a line width of 200 $\mu$m, a pitch of 300 $\mu$m and a height of 150 $\mu$m as shown in FIG. 5(b), and then the original plate 37 was removed from the substrate 31, as shown in FIG. 5(c).

Figure 5D:
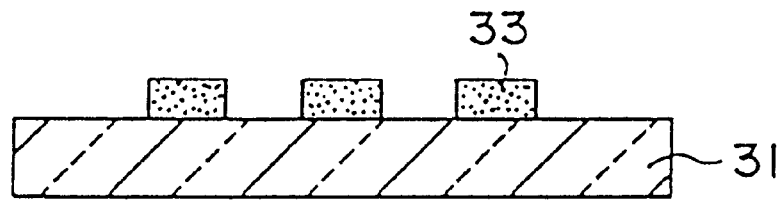

Next, in the same manner as the first embodiment, filling of the ceramic material 33 into the female mold 32 made by the organic foam on the substrate 31 was performed, and calcination was performed to thereby obtain a thick film pattern with a line width of 100 $\mu$m, a pitch of 300 $\mu$m and a height of 150 $\mu$m made by the ceramic material 33 as shown in FIG. 5(d).

Section 4

A Fourth Embodiment of a Method of Forming Thick Film Pattern 4-1 Basic Method

A basic process according to the fourth embodiment of the present invention will be described with reference to FIGS. 6(a) through 6(c).

Figure 6A:
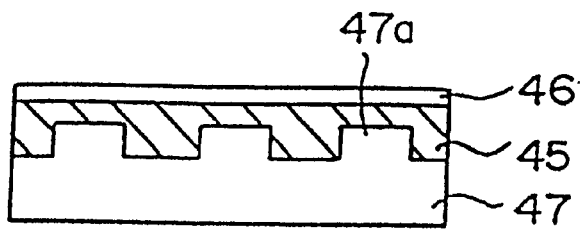
FIGS. 6(a) through 6(f) are explanatory views showing a method of forming a thick film pattern according to a fourth embodiment of the present invention.
Figure 6B:
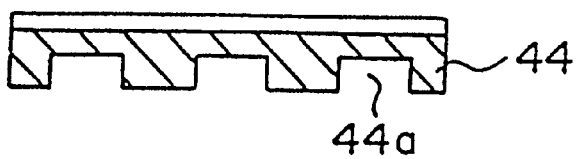
Figure 6C:
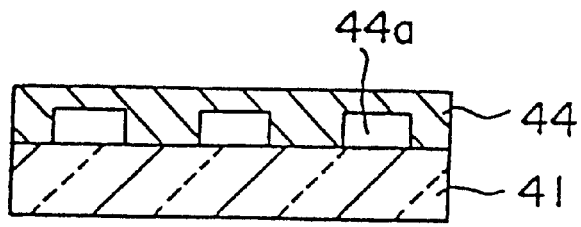
Figure 6D:
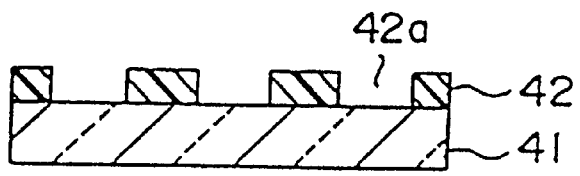
Figure 6E:
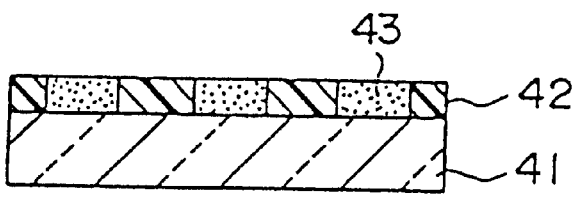
Figure 6F:
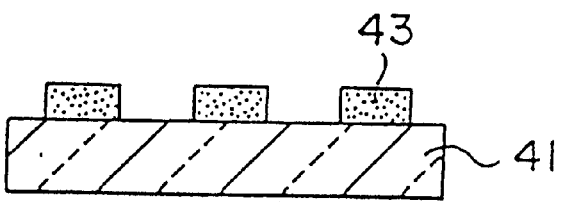
Figure 7A:
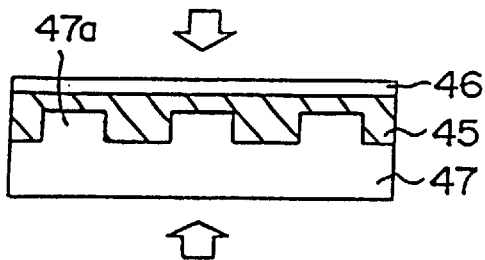
FIGS. 7(a) through 7(g) are explanatory views showing a forming process of a female mold according to a fourth embodiment of the present invention.
Figure 7B:
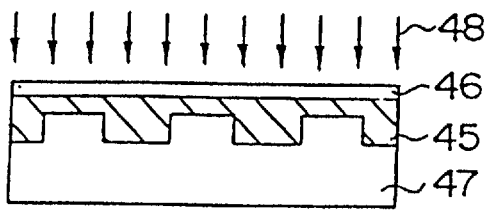
Figure 7C:
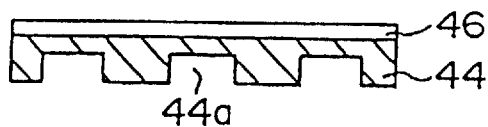
Figure 7D:
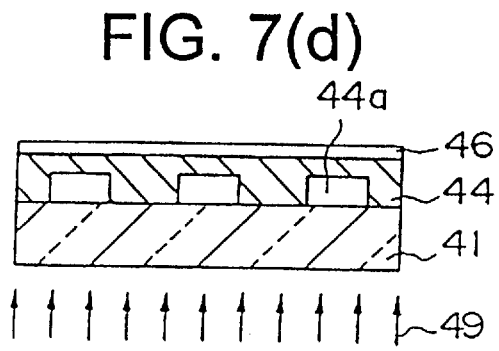
Figure 7E:
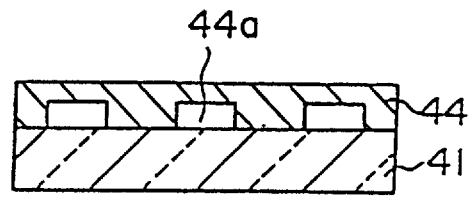
Figure 7F:
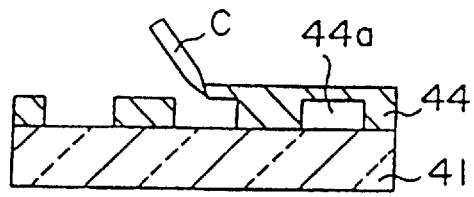
Figure 7G:
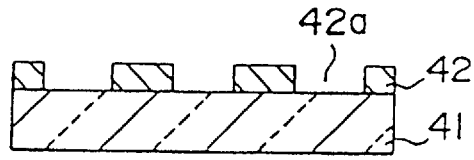

First, an original plate 47 having a concave-convex surface 47a corresponding to a desirable pattern is prepared as shown in FIG. 6(a). Uncured ultraviolet curing resin 45 is poured in the concave-convex surface 47a to coat the original plate 47, and a substrate film 46 is placed and extended on the uncured ultraviolet curing resin 45. Thereafter, ultraviolet rays are irradiated from the side of the substrate film 46 onto the ultraviolet curing resin 45 to cure the same, and then the ultraviolet curing resin 45 and the substrate film 46 are removed from the original plate 47 to thereby obtain the tentative female mold 44 to which the substrate film 46 adhered, as shown in FIG. 6(b). The tentative female mold 44 has grooves 44a with a desirable pattern.

Next, the tentative female mold 44 is brought into close contact with the substrate 41 made of glass or the like at the opposite side of the substrate film 46, ultraviolet rays are irradiated from the side of the substrate 41 to thereby bind the tentative female mold 44 and the substrate 41. Thereafter, the substrate film 46 is removed from the tentative female mold 44, thus obtaining the substrate 41 to which the tentative female mold 44 adhered as shown in FIG. 6(c).

In the case where the ultraviolet curing resin 45 is not completely cured to the lower side when ultraviolet rays are irradiated from the side of the substrate film 46 at the stage in FIG. 6(a), the tentative female mold 44 is brought into contact with the substrate 41 and ultraviolet rays are irradiated from the side of the substrate 41, thereby causing the tentative female mold 44 to adhere to the substrate 41. In the case where the ultraviolet curing resin 45 is cured to the lowermost side, a primer treatment is applied to the substrate 41 in advance. Furthermore, at the stage of FIG. 6(a), ultraviolet rays are irradiated from the side of the original plate 47 to cure the ultraviolet curing resin 45, thereby curing the lower side of the ultraviolet curing resin 45 completely. In this case, before the tentative female mold 44 is brought into contact with the substrate 41, the primer treatment is applied to the substrate 41 in advance, ultraviolet rays are irradiated from the side of the substrate 41, thereby causing the tentative female mold 44 to adhere to the substrate 41.

Next, the upper portion of the tentative female mold 44 thus formed is ground by a sharp tool such as a knife to thus form the female mold 42 having a desirable pattern as shown in FIG. 6(*d*). Thereafter, the ceramic material 43 comprising a conductor or insulator is filled in the spaces 42*a* of the female mold 42 as shown in FIG. 6(*e*), and calcination is performed to thereby cause the ceramic material 43 to adhere to the substrate 41 as shown in FIG. 6(*f*). At the same time or thereafter, the female mold 42 formed by the ultraviolet curing resin 45 is removed by a chemical reagent, thus obtaining the thick film pattern formed by the ceramic material 43.

4-2 Embodiment

Next, an embodiment of the present invention will be described with reference to FIGS. 7(*a*) through 7(*g*) and FIGS. 8(*a*) through 8(*c*).

FIGS. 7(*a*) through 7(*g*) show processes for forming a female mold in a method of forming a thick film pattern of the present invention.

In this embodiment, an original plate 47 having concave-convex surface 47*a* was formed so as to have a desirable pattern with a line width of 200 μm, a pitch of 300 μm and a depth of 180 μm by machining a brass plate on the market. A substrate film 46 was formed out of a polyester film which is processed to easily adhere (HP-7 50 μmt manufactured by Teijin Co.). In order to cure the ultraviolet curing resin 45 by irradiating ultraviolet rays, one of the original plate 47 and the substrate film 46 was required to be transparent. In this embodiment, the substrate film 46 was transparent.

As ultraviolet curing resin 45, acrylic monomer such as hydroxy-ethyl acrylate, hydroxy-ethyl methacrylate, neopentyl glycol diacrylate, or trimethylol propane triacrylate, acrylic oligomer such as epoxy acrylate, polyester acrylate, or urethane acrylate, or mixture of the above monomer and the above oligomer was preferable. In this embodiment, as ultraviolet curing resin 45, hydroxy pivalic acid ester neopentyl glycol diacrylate may be used. Furthermore, as the initiator, reagents on the market may be applicable, in this embodiment, 1-hydroxycyclohexyl phenyl ketone was used. The scope of the present invention is not restricted by the choice of the above monomer, oligomer or mixture. It is preferable to choose the ultraviolet curing resin which is easily removed in the calcinating process in FIG. 8. Furthermore, primer may be used in the case where only the ultraviolet curing resin 45 does not adhere to the substrate 46.

Next, this embodiment will be concretely described below.

The ultraviolet curing resin 45 was poured in the concave-convex surface 47*a* corresponding to a desirable pattern of the original plate 47. The substrate film 46 was placed and extended on the uncured ultraviolet curing resin 45 using a flat press or a laminate roll. Thereafter ultraviolet rays 48 were irradiated from the side of the substrate film 46 onto the ultraviolet curing resin 45 to cure the same as shown in FIG. 7(*b*). As an ultraviolet ray source, a high-pressure mercury lamp of 40 w/cm² was used and light 3.8 μJ/cm² was irradiated. Thereafter, the ultraviolet curing resin 45 and the substrate film 46 were removed from the original plate 47 to thereby obtain the tentative female mold 44, with a line width of 200 μm, a pitch of 300 μm and a height of 180 μm, to which the substrate film 46 was adhered as shown in FIG. 7(*c*). The tentative female mold 44 had grooves 44*a* with a required pattern.

Next, the tentative female mold 44 was closely brought into contact with the glass substrate 41 at the opposite side of the substrate film 46 using a flat press or a laminate roll, ultraviolet rays 49 were irradiated from the side of the glass substrate 41 to thereby adhere the tentative female mold 44 to the glass substrate 41, as shown in FIG. 7(*d*). Thereafter, the substrate film 46 was removed from the tentative female mold 44, thus obtaining the substrate 41 to which only the tentative female mold 44 adhered as shown in FIG. 7(*e*). Then the upper layer of the tentative female mold 44 on the glass substrate 41 was removed therefrom to thus form openings as shown in FIG. 7(*f*).

In this embodiment, a cutting tool C having a sharp blade like a knife was used to cut the upper layer of the tentative female mold 44 made of the ultraviolet curing resin 45, thereby forming the female mold 42 having a desirable pattern with a line width of 100 μm, a pitch of 300 μm and a height of 160 μm on the glass substrate 41 as shown in FIG. 7(*g*). The method of removing the upper layer of the tentative female mold 44 does not restrict the present invention, as far as sufficient openings are obtained, any method can be applied.

Figure 8A:
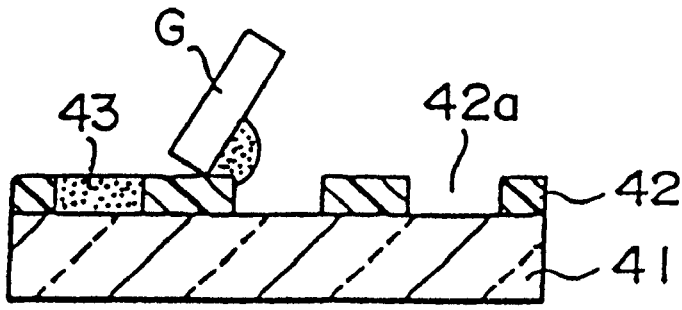
FIGS. 8(a) through 8(c) are explanatory views showing a filling process for a ceramic material and a calcinating process thereof according to a fourth embodiment of the present invention.
Figure 8B:
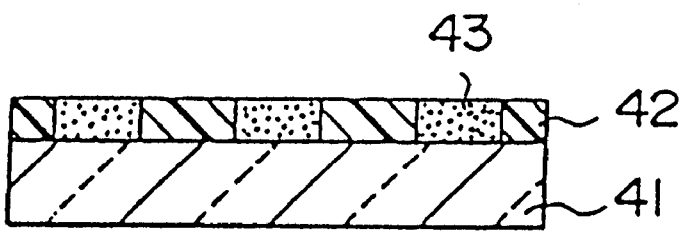
Figure 8C:
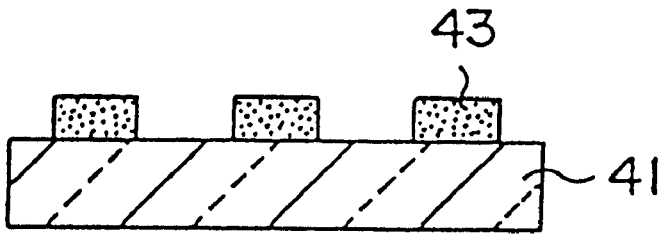

FIGS. 8(*a*) through 8(*e*) show the filling process for the ceramic material and calcinating process thereof.

As a ceramic material 43, a paste-like mixture containing glass frit having a low melting point, heat-resisting material and filling material dispersed in organic binder was used. A flat rubber plate G was brought into contact with the female mold 42 and moved parallel to the pattern of the female mold 42, whereby the paste-like ceramic material 43 was filled in the space 42*a* of the female mold 42 and excessive ceramic material which was formed out from the spaces 42*a* was scraped. Further, in order to remove the solvent contained in the organic binder in the ceramic material 43, the ceramic material 43 was dried at a temperature of 80 to 120° C. The filling process of the paste-like ceramic material 43 may be repeated, if necessary.

With the above processes, the article in which the ceramic material 43 was filled in the spaces 42*a* of the female mold 42 was formed as shown in FIG. 8(*b*). Thereafter, calcination was performed for 10 to 20 minutes at a temperature of 585° C., and the female mold 44 made of ultraviolet curing resin 45 was removed. At the same time, the ceramic material 43 was adhered to the glass substrate 41, and then the thick film pattern having a line width of 100 μm, a pitch of 300 μm and a height of 150 μm was obtained, as shown in FIG. 8(*c*).

4-3 Effect

According to the fourth embodiment, the following effects were obtained.

(1) Since the female mold was formed from the tentative female mold corresponding to the concave-convex surface of the original plate, a female mold having grooves with a trapezoidal cross-section could be easily formed.

(2) Since it was not necessary to use a dangerous reagent such as hydrofluoric acid as in the conventional method in which holes were formed on the glass substrate using hydrofluoric acid, working could be safely carried out.

Section 5

A Fifth Embodiment of a Method of Forming Thick Film Pattern 5-1 Embodiment

A method of forming a thick film pattern according to the fifth embodiment of the present invention will be described with reference to FIGS. 9(*a*) through 9(*h*).

Figure 9A:
FIGS. 9(a) through 9(h) are explanatory views showing a method of forming a thick film pattern according to a fifth embodiment of the present invention.
Figure 9B:
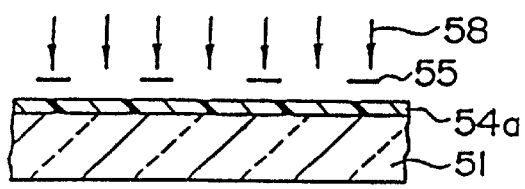

First, one layer of the photoresist 54*a* was provided on the glass substrate 51. That is, as photoresist, a dry film (Nopcocure F-5040 manufactured by San Nopco Limited) having a thickness of 40 μm was used, one layer was formed on the glass substrate 51 by a heating laminate method. Next, a parallel light 58 was irradiated onto the dry film using a parallel light printer incorporating an ultra high-pressure mercury lamp as a light source as shown in FIG. 9(b), thereby performing pattern exposure through a line pattern mask 55 having a line width of 100 μm and a pitch of 300 μm. The exposure condition was intensity of 200 μw/cm² and irradiation amount of 72 mJ/cm² when measuring by wave length of 365 nm.

Figure 9C:
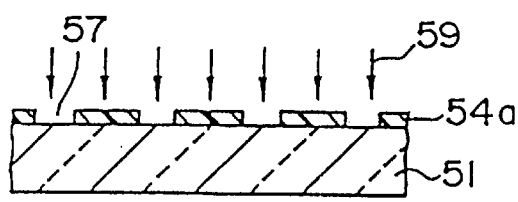

Next, in the developing process in FIG. 9(c), spray development was carried out by 1,1,1-trichloroethane 59 at liquid temperature of 25° C. In this case, the photoresist 54a had a thickness of 40 μm which was small, therefore, a desirable pattern was obtained by pattern exposure and development without the photoresist 54a remaining at the opening 57.

Figure 9D:
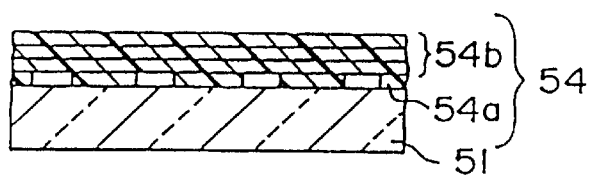
Figure 9E:
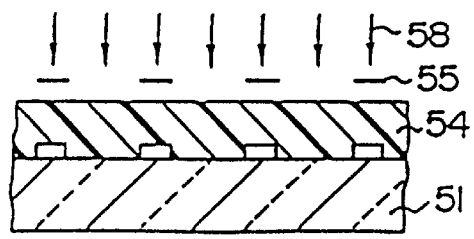

Thereafter, three layers of dry film were placed on one layer of the photoresist 54a to thereby form the upper layers of the photoresist 54b, whereby the photoresist 54 having four layers was formed as shown in FIG. 9(d). Next, a pattern exposure was performed by a parallel light 58 through the line pattern mask 55 as shown in FIG. 9(e). The exposure condition of this case had an intensity of 200 μw/cm² and irradiation amount of 200 mJ/cm² when measuring by wave length of 365 nm.

Figure 9F:
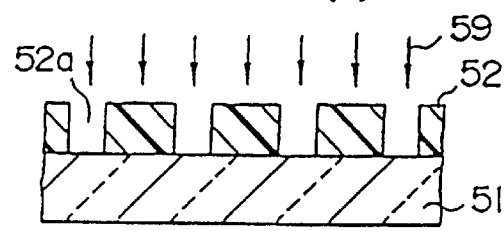

Thereafter, spray development was carried out by 1,1,1,-trichloroethane 59 at liquid temperature of 25° C., whereby the female mold 52 having a desirable pattern with a line width of 200 μm, a pitch of 300 μm and a height of 160 μm was obtained, as shown in FIG. 9(f). The female mold 52 had spaces 52a.

Figure 9G:
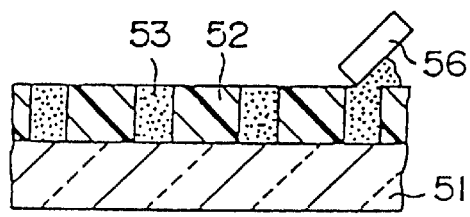

In the filling process in FIG. 9(g), as a ceramic material 53, a paste-like mixture containing glass frit having a low melting point, a heat-resisting pigment and a filling material dispersed in organic binder was used. A flat rubber plate 56 was brought into contact with the female mold 52 and moved across the pattern of the female mold 52, whereby the paste-like ceramic material 53 was filled in the spaces 52a of the female mold 52 and excessive ceramic material 53 which was forced out was scraped. Then, in order to remove the solvent contained in the organic binder in the ceramic material 53, the substrate 51 and the ceramic material 53 filled in the spaces 52a of the female mold 52 were dried at a temperature of 80 to 120 °C. and fed to the calcinating process. Incidentally, the filling process of the paste-like ceramic material 13 may be repeated, if necessary.

Figure 9H:
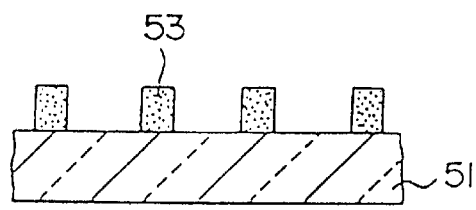

Finally, calcination was performed for 10 to 20 minutes at a peak temperature of 585° C., whereby the female mold 52 formed by the photoresist was removed and the ceramic material 53 was adhered onto the glass substrate 51. The thick film pattern made of the ceramic material 53 having a line width of 100 to 120 μm, a pitch of 300 μm and a height of 150 μm was obtained through the above processes as shown in FIG. 9(h).

5-2 Effect

According to the fifth embodiment, the following effect was obtained.

(1) Even if the female mold had a fine pattern with a certain height, the photoresist did not remain in the space of the female mold and the ceramic material filled in the space of the female mold was reliably adhered onto the substrate by the calcinating process.

Section 6

A Sixth Embodiment of a Method of Forming Thick Film Pattern 6-1 Embodiment

A method of forming a thick film pattern according to the sixth embodiment of the present invention will be described with reference to FIG. 10(a) through 10(g).

Figure 10A:
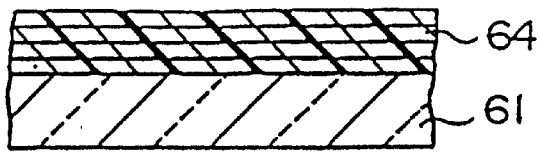
FIGS. 10(a) through 10(g) are explanatory views showing a method of forming a thick film pattern according to a sixth embodiment of the present invention.
Figure 10B:
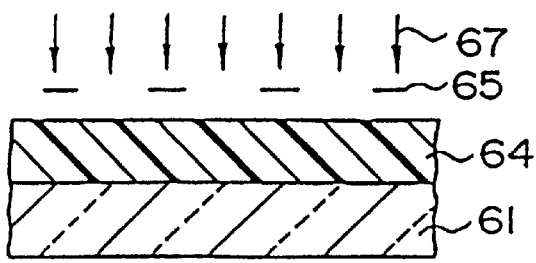

First, a dry film (Nopcocure F-540 manufactured by San Nopco Limited.) having a thickness of 40 μm was arranged in four layers by a heating laminate method to thereby form the photoresist layer 64 having a thickness of 160 μm as shown in FIG. 10(a). Next, a parallel light 65 was irradiated onto the dry film using a parallel light printer incorporating a ultra high-pressure mercury lamp as a light source as shown in FIG. 10(b), thereby performing pattern exposure through a line pattern mask 65 having a line width of 100 μm and a pitch of 300 μm. The exposure condition was an intensity of 200 μw/cm² and an irradiation amount of 230 mJ/cm² when measured by a wave length of 365 nm.

Figure 10C:
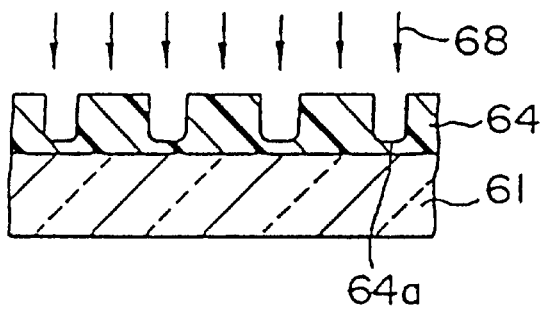

Next, a spray development was carried out by mixture 68 of 1,1,1-trichloroethane and dichloromethane (mixing rate 4:1) at liquid temperature of 25° C., thereby obtaining the photoresist 64 having a desirable pattern as shown in FIG. 10(c).

Figure 10D:
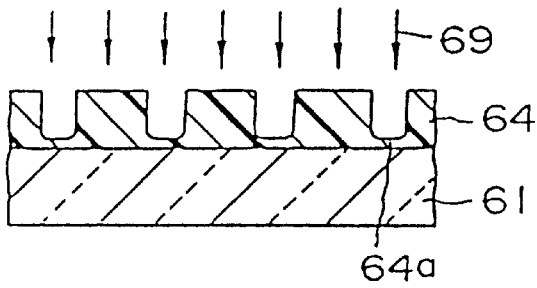
Figure 10E:
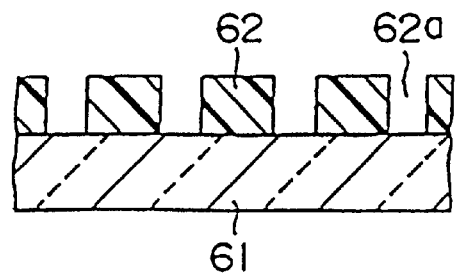

In this case, the photoresist 64 had a thickness of 160 μm, a part 64a of photoresist remained in the concave of the pattern at the stage of developing. Therefore, the remaining part of the photoresist was removed by dry etching, for example, plasma ashing by reactive gas 69 as shown in FIG. 10(d).

The condition of the plasma ashing was a reactive gas pressure of 20 mm Torr, the degree of vacuum of 9×10⁻⁵ Torr, and substrate's rotational speed of 1 rpm. Furthermore, the reactive gas was oxygen (O₂) and the flow rate of the reactive gas was 30 SCCM. The ashing time was 30 minutes.

The female mold 62 having a thick film pattern with a line width of 200 μm, a pitch of 300 μm and a height of 150 μm was obtained through the above processes. The female mold 62 had spaces 62a. Ion etching containing O₂ and CF₄, or other dry etching was effective to remove the photoresist 64a which remained on the substrate 61.

Figure 10F:
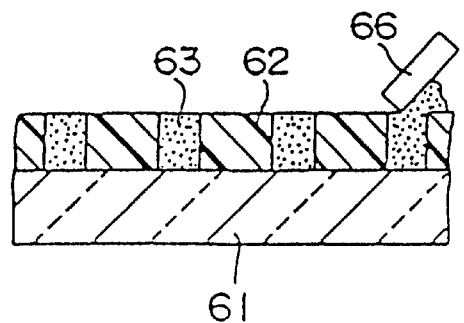

In the filling process in FIG. 10(f), as the ceramic material 63, a paste-like mixture containing glass frit having a low melting point, heat-resisting pigment and a filling material dispersed in organic binder was used. A flat rubber plate 66 was brought into contact with the female mold 62 and moved across the pattern of the female mold 62, whereby the paste-like ceramic material 63 was filled in the spaces 62a of the female mold 62 and excessive ceramic material 63 which was forced out was scraped. Then, in order to remove the solvent contained in the organic binder in the ceramic material 63, the substrate 61 and the ceramic material 63 filled in the spaces 62a of the female mold 62 were dried at a temperature of 80 to 120° C. and fed to the calcinating process. Incidentally, the filling process of the paste-like ceramic material 63 may be repeated, if necessary.

Figure 10G:
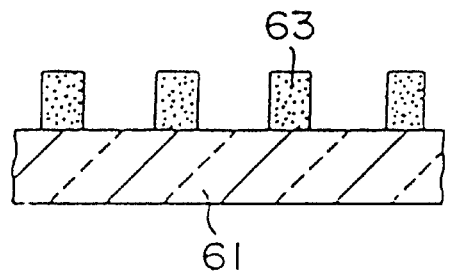

Finally, calcination was performed for 10 to 20 minutes at a peak temperature of 585° C., whereby the female mold 62 formed by the photoresist was removed and the ceramic material 63 adhered onto the glass substrate 61. The thick film pattern made of the ceramic material 63 having a line width of 100 to 120 μm, a pitch of 300 μm and a height of 150 μm was obtained through the above processes as shown in FIG. 10(g).

6-2 Effect

According to the sixth embodiment, the following effects were attained.

(1) Since the female mold on which the photoresist did not remain was formed, the ceramic material filled in the space of the female mold reliably adhered onto the substrate by calcinating process.

Section 7

A Seventh Embodiment of a Method of Forming Thick Film Pattern 7-1 Basic Method

A method of forming a thick film pattern according to the seventh embodiment of the present invention will be described below.

First, a photoresist layer is formed on the substrate, and a pattern exposure and development are performed to the photoresist layer to thereby form the female mold having a desirable pattern. Thereafter, inorganic paste material containing powder solid dispersed in inorganic liquid vehicle comprising water glass as main ingredient is filled in spaces of the female mold. Next, calcination is performed to remove the female mold, and the powder solid is adhered onto the substrate to thereby obtain a desirable thick film pattern, with water glass in inorganic paste material serving as a binder. As water glass serves as the vehicle in the inorganic paste material, water glass containing sodium silicate as main ingredient is used, the molecular formula of the water glass being $Na_2O \cdot nSiO_2 \cdot mH_2O$. There are three types of water glass in standard, that is, No. 1, No. 2, No. 3 according to the ratio of $Na_2O$ to $SiO_2$, every type can be used in this embodiment. Furthermore, the inorganic paste material containing water glass of 10 to 90% by weight is used. To be more specific, the paste material loses fluidity in the case of water glass of less than 10% by weight, and it is difficult to carry out filling process. On the contrary, in the case of water glass of above 90% by weight, the rate of powdery solid in the inorganic paste material is small, therefore, the thick film pattern cannot be formed. Taking into consideration fluidity in the form of paste, the inorganic paste material preferably contains the water glass of 20 to 50% by weight so that it is filled into the fine spaces of the female mold and so that excessive material which is forced out from the pattern is easily scraped.

On the other hand, as powdery solid in the inorganic paste material, aggregate and pigment are used in a mixed state. As the aggregate, silica, alumina, zirconia, silicon carbide (SiC), boron nitoride (BN), stainless steel (SUS), mica, or the like may be used, further, as the pigment, chromium oxide, iron oxide, cobalt oxide, titanium oxide, molybdenum oxide, copper oxide, aluminum, or the like may be used.

The scope of the present invention is not restricted by the choice of the above aggregate and pigment, suitable aggregate and pigment may be used in accordance with purpose. Furthermore, if necessary, curing agent, stabilizer, disperse agent or the like may be added to the inorganic paste material.

7-2 Embodiment

An embodiment of the present invention will be described with reference to FIGS. 11(a) through 11(e).

Figure 11A:
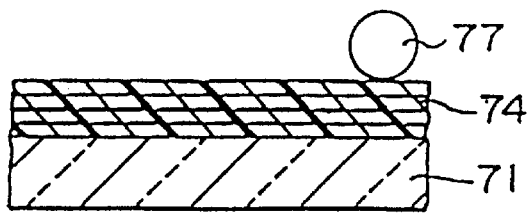
FIGS. 11(a) through 11(e) are explanatory views showing a method of forming a thick film pattern according to a seventh embodiment of the present invention.
Figure 11B:
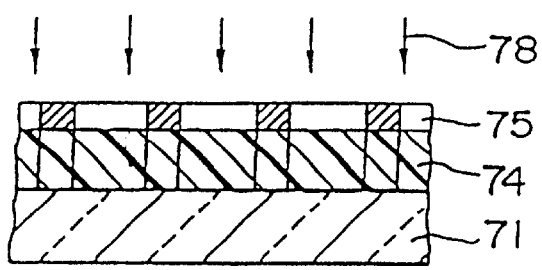
Figure 11C:
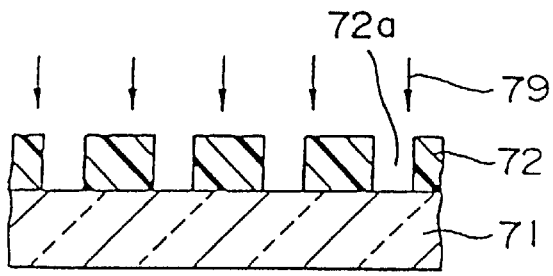

First, a resist film (Nopcocure F-5040 manufactured by Sun Nopco Limited, film thickness 40 μm) of original type was arranged in four layers on a glass substrate 71 which was heated at a temperature of 90° C. using a laminate roll 77, thereby forming a photoresist layer 74 having a thickness of 160 μm as shown in FIG. 11(a). Next, ultraviolet rays 78 were irradiated with a irradiation amount of 250–300 mJ/cm² onto the photoresist layer 74 through a film mask 75 having a line pattern by a contacting printer from the side of the film mask 75. Thereafter, a spray development was performed on the unexposed portions by solution 79 in which dichloromethane of 20% by volume was mixed in 1,1,1-trichloroethane, thereby forming a female mold 72 having the required pattern with line-like spaces 72a having a line width of 100 μm, a pitch of 300 μm as shown in FIG. 11(c).

Figure 11D:
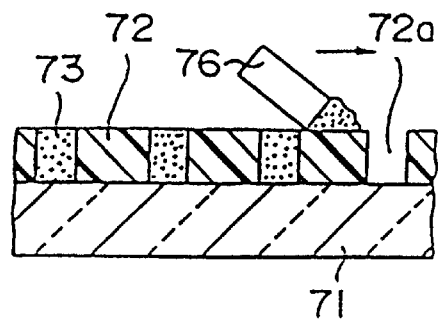

Next, a flat rubber plate 76 was brought in contact with the space 72a of the female mold 72 and moved parallel to the pattern of the female mold 72, whereby the inorganic paste material 73 was filled in the space 72a of the female mold 72 and excessive material 73 which was forced out was scraped as shown in FIG. 11(d).

| Vehicle: | |
|---|---|
| water glass No. 2 (sodium silicate manufactured by Toyo Keisan Soda Co.) | 30% by weight |
| Powdery solid: | |
| alumina beads (CB-AO5S manufactured by Showa Denko Co.) Heat resistant black pigment (Daipirokiside color #9590 manufactured by Dainichiseika) | 60% by weight |

Furthermore, in order to remove water contained in the inorganic paste material 73, the inorganic paste material 73 was dried at a temperature of 80 to 90° C. Incidentally, the filling process of the paste material 73 may be repeated, if necessary.

Figure 11E:
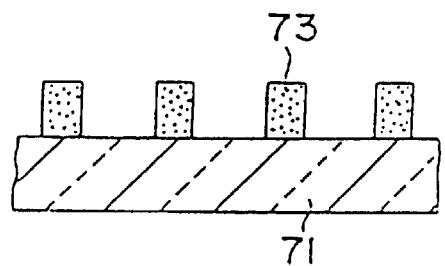

Finally, calcination was performed for 30 to 60 minutes at a peak temperature of 450° C., whereby the female mold 72 formed by photoresist was ashed and removed, and the powdery solid of the inorganic paste material 73 adhered onto the glass substrate. The thick film pattern having a line width of 100 μm, a pitch of 300 μm and a thickness of 150 μm was obtained through the above processes as shown in FIG. 11(e).

The glass substrate 71 on which the thick film pattern was formed was used as a base plate having cell barriers in the plasma display panel. In this case, ultraviolet rays were generated by electric discharge between cells, both the thick film pattern 73 was not deteriorated because water glass which was binder of the thick film pattern 73 had an excellent radiation resistance. Therefore, the glass substrate 71 having the thick film pattern 73 was effective as cell barriers of the plasma display panel.

7-3 Effect

According to the seventh embodiment, the following effects were attained.

(1) Since the inorganic paste material in which powdery solid was dispersed in inorganic liquid vehicle made by water glass as main ingredient was used as a ceramic material filled into a female mold, the volume change of the inorganic paste material was small in the drying process and the calcinating process, and so the inorganic paste material was prevented from being broken.

(2) The bonding force between the powdery solid and the adhesive force between the powdery solid and the substrate were enhanced by the existence of water glass.

(3) After the calcinating process, organic material did not remain unlike the conventional paste including organic medium, so that the thick film pattern was formed by calcinating process of lower temperature than before.

INDUSTRIAL APPLICABILITY

The present invention is widely applicable to manufacture of liquid crystal display devices, fluorescent display devices, plasma display panels, and hybrid integrated circuits or the like.

What is claimed is:

1. In a method of forming a thick film pattern of ceramic material on a supporting substrate, the method comprising the steps of:

coating ultraviolet curing resin on an original plate having a concave-convex surface corresponding to a desirable pattern;

providing and extending a substrate film on said ultraviolet curing resin;

forming a tentative female mold having a groove with a desirable pattern on said substrate film after curing said ultraviolet curing resin by ultraviolet rays and removing the same from said original plate;

causing said tentative female mold carrying said substrate film to adhere to said substrate in such a manner that said groove is in confrontation with said supporting substrate;

removing the upper portion of said tentative female mold after removing said substrate film from said tentative female mold to define a final female mold having a desirable pattern with upwardly open spaces on said supporting substrate;

filling said ceramic material in only the upwardly open spaces formed in said final female mold; and calcining to cause said final female mold to vanish.

2. The method of claim 1, wherein the step of causing the tentative female mold to adhere to said supporting substrate comprises the steps of:

bringing said tentative female mold in contact with said supporting substrate; and irradiating said ultraviolet rays onto said tentative female mold.

* * * * *